(12) United States Patent
Fukazawa et al.

(10) Patent No.: US 7,651,959 B2
(45) Date of Patent: Jan. 26, 2010

(54) METHOD FOR FORMING SILAZANE-BASED DIELECTRIC FILM

(75) Inventors: Atsuki Fukazawa, Tama (JP); Jeongseok Ha, Tama (JP); Nobuo Matsuki, Tama (JP)

(73) Assignee: ASM Japan K.K., Tokyo (JP)

( * ) Notice: Subject to any disclaimer, the term of this patent is extended or adjusted under 35 U.S.C. 154(b) by 51 days.

(21) Appl. No.: 11/949,701

(22) Filed: Dec. 3, 2007

(65) Prior Publication Data

US 2009/0142935 A1 Jun. 4, 2009

(51) Int. Cl.
*H01L 21/469* (2006.01)

(52) U.S. Cl. ............... 438/786; 438/769; 438/792; 257/639; 257/649; 257/E21.267; 427/255.29; 427/488; 427/489; 427/533

(58) Field of Classification Search ......... 438/792–794, 438/782, 769; 257/77, 639, 649, E21.267; 427/255.29

See application file for complete search history.

(56) References Cited

U.S. PATENT DOCUMENTS

| | | | |
|---|---|---|---|
| 5,393,815 | A | 2/1995 | Takeda et al. |
| 5,487,920 | A | 1/1996 | Lopata et al. |
| 5,922,411 | A | 7/1999 | Shimizu et al. |
| 6,352,945 | B1 | 3/2002 | Matsuki et al. |
| 6,383,955 | B1 | 5/2002 | Matsuki et al. |
| 6,403,486 | B1 | 6/2002 | Lou |
| 6,410,463 | B1 | 6/2002 | Matsuki |
| 6,432,846 | B1 | 8/2002 | Matsuki et al. |
| 6,436,822 | B1 | 8/2002 | Towle |
| 6,455,445 | B2 | 9/2002 | Matsuki |
| 6,503,843 | B1 * | 1/2003 | Xia et al. ............ 438/706 |
| 6,514,880 | B2 | 2/2003 | Matsuki et al. |
| 6,740,602 | B1 | 5/2004 | Hendriks et al. |

(Continued)

FOREIGN PATENT DOCUMENTS

EP 1 225 194 A2 7/2002

(Continued)

OTHER PUBLICATIONS

Gerstenberg ("On Structure and Properties of Plasmapolymerized Organ-Silicon Films", IEEE symposium on Electrical Insulation, Boston, MA, pp. 141-144, Jun. 5-8, 1988).*

(Continued)

*Primary Examiner*—Charles D Garber
*Assistant Examiner*—Yasser A Abdelaziez
(74) *Attorney, Agent, or Firm*—Knobbe, Martens, Olson & Bear LLP

(57) ABSTRACT

A method of forming a dielectric film includes: introducing a source gas essentially constituted by Si, N, H, and optionally C and having at least one bond selected from Si—N, Si—Si, and Si—H into a reaction chamber where a substrate is placed; depositing a silazane-based film essentially constituted by Si, N, H, and optionally C on the substrate by plasma reaction at −50° C. to 50° C., wherein the film is free of exposure of a solvent constituted essentially by C, H, and optionally O; and heat-treating the silazane-based film on the substrate in a heat-treating chamber while introducing an oxygen-supplying source into the heat-treating chamber to release C from the film and increase Si—O bonds in the film.

25 Claims, 4 Drawing Sheets

U.S. PATENT DOCUMENTS

| | | |
|---|---|---|
| 6,784,123 B2 | 8/2004 | Matsuki et al. |
| 6,818,570 B2 | 11/2004 | Matsuki et al. |
| 6,835,664 B1 | 12/2004 | Sarigiannis et al. |
| 6,881,683 B2 | 4/2005 | Matsuki et al. |
| 6,890,869 B2 | 5/2005 | Chung |
| 7,064,088 B2 | 6/2006 | Hyodo et al. |
| 7,354,873 B2 | 4/2008 | Fukazawa et al. |
| 2001/0055889 A1 | 12/2001 | Iyer |
| 2003/0100175 A1 | 5/2003 | Nobutoki et al. |
| 2003/0194880 A1 | 10/2003 | Singh et al. |
| 2004/0137757 A1 | 7/2004 | Li et al. |
| 2005/0129932 A1 | 6/2005 | Briley |
| 2006/0014399 A1 | 1/2006 | Joe |
| 2006/0078676 A1* | 4/2006 | Lukas et al. ............. 427/248.1 |
| 2006/0110931 A1 | 5/2006 | Fukazawa et al. |
| 2006/0228866 A1 | 10/2006 | Ryan et al. |
| 2006/0240652 A1 | 10/2006 | Mandal |
| 2006/0258176 A1 | 11/2006 | Fukazawa et al. |
| 2007/0004204 A1 | 1/2007 | Fukazawa et al. |
| 2007/0065597 A1 | 3/2007 | Kaido et al. |
| 2007/0289534 A1 | 12/2007 | Ludomirsky et al. |
| 2008/0076266 A1 | 3/2008 | Fukazawa et al. |
| 2008/0305648 A1 | 12/2008 | Fukazawa et al. |

FOREIGN PATENT DOCUMENTS

| | | |
|---|---|---|
| JP | 2006-054353 | 2/2006 |

OTHER PUBLICATIONS

U.S. Appl. No. 11/759,159, filed Jun. 6, 2007, Atsuki Fukazawa, et al.

A. J. Kalkman et al., $SiOF_x$ and $SiO_2$ deposition in an ECR-HDP reactor: Tool characterization and film analysis, Microelectronic Engineering 37-38(1999) 271-276.

W. J. Lee et al., Device Isolation Technology on Semiconductor Substrate, U.S. Appl. No. 12/130,522, filed May 30, 2008.

* cited by examiner

METHOD FOR FORMING SILAZANE-BASED DIELECTRIC FILM

BACKGROUND OF THE INVENTION

1. Field of the Invention

The present invention relates generally to a semiconductor technique and more particularly to a silicone-containing dielectric film having good filling or padding property for an interconnect structure of a semiconductor substrate.

2. Description of the Related Art

The requirements for semiconductor processing technologies are increasing as the device nodes continue to become smaller, and the requirements for hard masking are also getting higher to improve the processing performance from dry etching. Also, conventional film forming technologies cannot form desired insulation films in STI and Bit lines, etc., and therefore improvements, modifications and new process applications are being examined.

High-density plasma CVD that provides filling characteristics was first applied to 250-nm node devices, after which the technology was applied to wiring and passivation processes of various devices. As the device node decreased, efforts were made to improve the film quality and the technology became the standard in the application of embedded oxide films in PMD and STI processes. When the device node became smaller than 130 nm, however, it became difficult to meet the need for fully-filling in STI processes with high-density plasma CVD, and therefore other technologies were adopted such as raising the bottom of the STI structure with a coating material and then filling a film using high-density plasma CVD. At the same time, measures are being taken to improve the film forming and etching technologies based on high-density plasma CVD in order to meet the required filling characteristics.

Since the reduction in width increases the aspect ratio, use of high-density plasma CVD is also becoming difficult in PMD processes.

Now that device nodes smaller than 50 nm are available, STI openings have become smaller than 30 nm and PMD sizes have dropped to less than 50 nm, and accordingly new filling technologies are needed. As specific methods, forming technologies using coating materials, film forming technologies using thermal CVD with O3, combined technologies using a combination of multiple films, and technologies that use siloxane reaction via plasma CVD have been evaluated. In STI processes, the maximum temperature is high, or around 800 to 1,000° C., and thus the gases released from the embedded film react inside the film and dissociate from the film, which results in a space film structure. Also in the chemical solution step performed after the CMP step in the STI process, fluorinated gases are used and thus the embedded film must be resistant to wet etching. Films that become sparse after heat treatment allow chemical solutions to permeate quickly. This leads to a higher etch rate, and the rate may become different in each location of the film embedded in the STI structure. It has been shown that, when siloxane reaction is used, voids inevitably generate during heat treatment because of the OH bond in the film, and consequently the wet resistance and other properties decrease.

SUMMARY OF THE INVENTION

In SOD processes, use of silazane reaction is mainly evaluated. However, the object of using silazane reaction is to replace Si—N bond with Si—O, and a large amount of solvent is contained in the system to achieve flowability. As a result, the film shrinks significantly.

STI structures have a thin silicon nitride film formed on them to suppress oxidization of silicon. However, the embedded film formed on the thin nitride film shrinks during heat treatment, and this shrinkage generates stress in the silicon nitride film and causes the film to break. To prevent the above problem, it is essential to change the SOD materials themselves. Specifically, film shrinkage can be suppressed by lowering the solvent ratio. However, reducing the amount of solvent affects the flowability, which leads to insufficient filling performance. In effect, there is a trade-off relationship between film shrinkage and filling performance. Controlling the thickness of embedded film is difficult because of the material of the foundation film, and this makes it difficult to halve the thickness of embedded films in STI structures.

Based on the above, application of films offering high controllability and stability is essential in STI processes. The same is true with PMD processes.

The inventor conducted a plasma CVD experiment using SiH4+NH3 as the base gas and also using xylene, which is a hydrocarbon material, as an additive. When a film was formed at a susceptor temperature of 0° C., the formed film contained silazanes mainly constituted by Si—N, Si—H and N—H, and hydrocarbons such as Si—CH3 and CHx. Accordingly, it was confirmed that heat treatment at high temperature would cause carbons to dissociate completely, which allows a silicon oxide film having a Si—O skeleton to be formed. The embedded film also had a favorable shape and the film composition did not present the problem in high-temperature resistance occurring in siloxane processes. However, use of a hydrocarbon solvent caused the film to shrink significantly, or 25% or more, as a result of heat treatment. The cause of shrinkage is the dissociation of constituents due to the added hydrocarbon, and concerns remain as to the impact on the protective film formed underneath and whether carbon is fully removed from the embedded film formed in areas of high aspect ratios. Based on the above, a film forming method that allows less carbon to be introduced into the film, or a method that does not cause carbonization at all, is preferable because using hydrocarbon solvents expressed by $C\alpha H\beta O\gamma$, which are traditionally used to improve filling performance, presents concerns over film shrinkage and carbon residue.

In an embodiment where at least one problem can be solved, the present invention provides a method of forming a dielectric film, comprising: (i) introducing a source gas essentially constituted by Si, N, H, and optionally C and having at least one bond selected from Si—N, Si—Si, and Si—H into a reaction chamber where a substrate is placed; and (ii) depositing a silazane-based film essentially constituted by Si, N, H, and optionally C on the substrate by plasma reaction at −50° C. to 50° C., wherein the film is free of exposure of a solvent constituted essentially by C, H, and optionally O.

The above embodiment further includes, but is not limited to, the following embodiments:

In an embodiment, the method may further comprise heat-treating the silazane-based film on the substrate in a heat-treating chamber while introducing an oxygen-supplying source into the heat-treating chamber to release C from the film and increase Si—O bonds in the film. In the above, the heat-treatment step may comprise introducing $H_2O$ as the oxygen-supplying source into the heat-treating chamber and annealing the film at a temperature of 85° C.-150° C. Further, the heat-treatment step may comprise introducing $O_2$, $O_3$, $CO_2$, $N_2O$, and/or $H_2O$ as the oxygen-supplying source and an inert gas into the heat-treating chamber and annealing the film at a temperature of 200° C.-600° C. Alternatively or additionally, the heat-treatment step may comprise introducing $O_2$, $O_3$, $CO_2$, $N_2O$, and/or $H_2O$ as the oxygen-supplying source and an inert gas into the heat-treating chamber and annealing the film by UV curing. In any of the foregoing embodiments, the method may further comprise high heat-treating the film at a temperature of 700° C.-1,000° C. in an inert gas environment upon the heat treatment step. Additionally, the method may further comprise treating a surface of the substrate with a plasma using He, Ar, or $N_2$ for improving affinity to the silazane-based film prior to the gas-introducing step. Further, the method may further comprise cleaning the reaction chamber at a temperature of higher than 50° C. after the film depositing step is repeated multiple times.

In any of the foregoing embodiment, the substrate may be placed between capacitively-coupled electrodes, between which a plasma is generated in the deposition step. In the above, the source gas may be constituted essentially by Si, H, and N, and a gap between the electrodes is set at 16 mm or less in the deposition step. The source gas may be constituted essentially by Si, H, N, and C, and a gap between the electrodes is set at 16 mm or more in the deposition step. RF power applied to the electrodes may be 600 W or less in the deposition step.

In any of the foregoing embodiments, the source gas may be a mixture of a gas constituted by Si, H, and optionally C, and a gas constituted by N and optionally H. The gas constituted by N and optionally H may be $NH_3$ or/and $N_2$.

In any of the foregoing embodiments, the substrate may be a semiconductor substrate which has an irregular surface including a concave portion. The concave portion may be filled with the film by conducting the gas-introducing step and the deposition step once or by repeating the gas-introducing step and the deposition step multiple times, and then the heating-treatment step is conducted. The concave portion of the irregular surface may have holes or grooves, and the deposition step may be performed on the irregular surface to fill the holes or grooves with the inorganic silazane-based film.

In any of the foregoing embodiments, the substrate may have a silicon oxide conformal film formed from a siloxane material, on which the silazane-based film is deposited in the deposition step.

In any of the foregoing embodiments, the silazane-based film may be comprised of multiple silazane-based films which are constituted by Si, N, and H, and/or constituted by Si, N, H, and C.

In any of the foregoing embodiments, in the gas-introducing step, an inert gas may be added. Further, in the gas-introducing step, no oxygen-supplying gas may be introduced into the reaction chamber.

In another aspect, the present invention provides a method for forming an interconnect structure, comprising: (a) forming a three-dimensional structure for interconnect in a substrate; and (b) forming an insulation layer on a surface of the three-dimensional structure using a method comprising: (i) introducing a source gas essentially constituted by Si, N, H, and optionally C and having at least one bond selected from Si—N, Si—Si, and Si—H into a reaction chamber where a substrate is placed; (ii) depositing a silazane-based film essentially constituted by Si, N, H, and optionally C on the substrate by plasma reaction at −50° C. to 50° C., wherein the film is free of exposure of a solvent constituted essentially by C, H, and optionally O; and (iii) heat-treating the silazane-based film on the substrate in a heat-treating chamber while introducing an oxygen-supplying source into the heat-treating chamber to release C from the film and increase Si—O bonds in the film.

In any of the foregoing embodiments, the method may further comprise wet-etching the insulation film. The step of forming a three-dimensional structure may comprise forming a layer of aluminum, tungsten, or tungsten silicon as a wiring layer and etching the layer in a pattern.

For purposes of summarizing the invention and the advantages achieved over the prior art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention.

DETAILED DESCRIPTION OF THE PREFERRED EMBODIMENT

Figure 1:
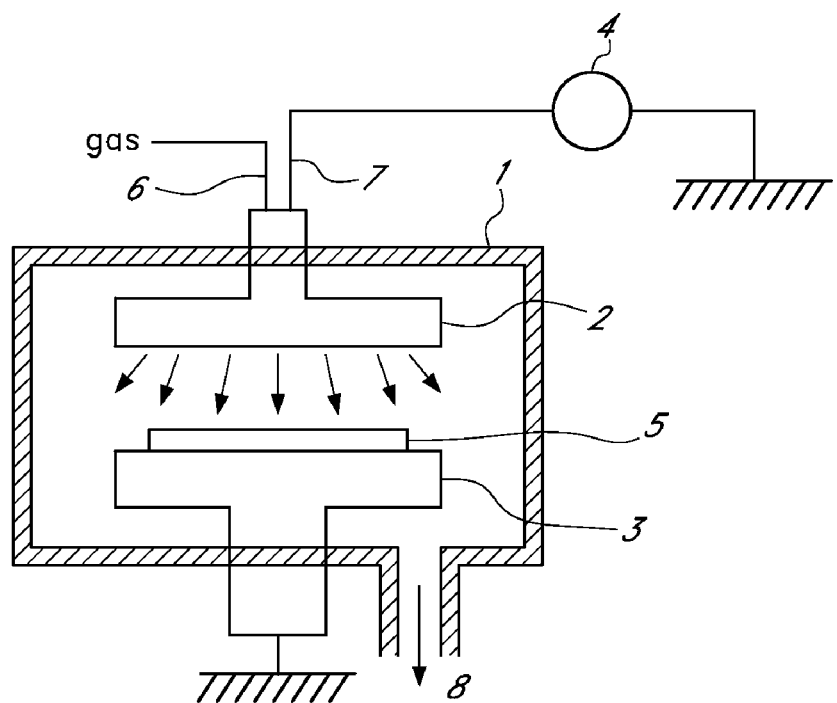
FIG. 1 is a schematic diagram illustrating a plasma CVD apparatus usable forming an inorganic silazane-based film in an embodiment of the present invention.

The present invention includes the above mentioned embodiments and other various embodiments including the following. The embodiments are not intended to limit the present invention.

1) A method for forming an insulation film having filling characteristics through plasma CVD with the susceptor temperature kept within a range of −50 to 50° C., characterized in that plasma CVD is implemented using a material whose base structure is SixHyCz or SixNyCzHa containing at least one of Si—N, Si—Si and Si—H bonds (x, y and a are arbitrary integers, while z is an integer including 0) to form a film constituted by SixNyHz or SixNyCzHa (x, y, z and a are arbitrary integers) and having a silazane skeleton, without using solvents employed by conventional methods to improve flowability. Since a silazane-based film is formed without using hydrocarbon solvents, etc., expressed by $C\alpha H\beta O\gamma$, which are traditionally used to improve filling performance, the amount of carbon introduced into the film can be reduced or a film not containing carbon can be formed, and this reduces the concerns over film shrinkage and carbon residue.

It is also possible to mix at least one type of carbon-containing $Si_xH_yC_z$ gas and at least one type of carbon-containing $Si_xN_yC_zH_a$ gas.

2) A method according to 1) above, characterized in that the amount of carbon-containing silicon material (z=0) is minimized (to a flow rate of less than 50%, or preferably 1 to 10%, to the flow rate of all material gases combined) to form a carbon-containing silazane-based film in order to ensure low carbon content and good flowability regardless of the discharge gap.

3) A method according to 1) or 2) above, characterized in that, if plasma CVD of parallel plate type is used, the RF power is adjusted to 600 W or less. Particularly with a silazane-based film containing virtually no carbon in the film, which is subject to lower flowability, the flowability during the film forming process can be improved by adjusting the power to a low level of 600 W or less (including, for example, 400 W, 200 W, 100 W, 50 W, 10 W, and powers between any two of the foregoing; or preferably 100 W or less).

4) A method according to 1) or 3) above, characterized in that the flow rate of the nitrogen additive such as N2 or NH3, being used as the source of N, is in a range of 1 to 5,000 sccm (including, for example, 10 sccm, 100 sccm, 500 sccm, 1,000 sccm, 2,000 sccm, and flow rates between any two of the foregoing).

5) A method according to any one of 1) to 4) above, characterized in that, if a material whose base structure is $Si_xN_yH_z$ is used, the discharge gap is adjusted to 16 mm or less. Particularly with a silazane-based film containing virtually no carbon in the film, which is subject to lower flowability, the flowability during the film forming process can be improved by adjusting the discharge gap to 16 mm or less (including, for example, 14 mm, 12 mm, 10 mm, 8 mm, 6 mm, 4 mm, 2 mm, and gaps between any two of the foregoing).

6) A method according to any one of 1) to 4) above, characterized in that, if a material whose base structure is $Si_xN_yC_zH_a$ is used, the discharge gap is adjusted to 16 mm or more (including, for example, 18 mm, 20 mm, 25 mm, 30 mm, and gaps between any two of the foregoing).

7) A method according to 1) to 6) above, characterized in that a silazane-based film is formed on a pattern having surface irregularity and, if the film is embedded in a concaved section, the pattern height is divided into several levels to form an embedded film over multiple sessions and then heat treatment is performed, after which the steps are repeated to achieve more complete filling, to improve the stability and density of the embedded film, instead of the normal process of completing filling in a single film forming process and then performing heat treatment. The method is also characterized in that formation of embedded film and heat treatment are alternated to form a more complete embedded film. (Heat treatment conditions are selected according to the purpose.)

The concave portion of the irregular surface may have holes or grooves, and the deposition step is performed on the irregular surface to fill the holes or grooves with the insulation film. In an embodiment, the irregular surface may have a three-dimensional structure of SiN, SiO, Poly-Si, Cu, or Si.barrier metal, or in another embodiment, aluminum, tungsten, or tungsten silicon. The irregular surface with the concave portion may be a patterned surface for wiring. Further, the concave portion of the irregular surface of the substrate may have an aspect ratio of about 1/3 to about 1/10. For a high aspect ratio such as 1/3 to 1/10 (e.g., a Shallow Trench Isolation (STI) structure formed in a Si substrate) or a wiring pitch of 100 nm or less (e.g., 45 nm to 100 nm for an Al/low-k structure), the inorganic silazane-based film with $C_xH_y$ gas can fill in the holes or grooves without creating voids.

8) A method according to any one of 1) to 7) above, characterized in that a conformal thin silicon oxide film is formed using a siloxane-based material, TEOS or SiH4, after which a silazane-based film is formed. This way, the conformal process and gap-filling process can be performed successively. The method is also characterized in that the obtained film comprises a laminated structure constituted by multiple films that are all silazane-based films. The conditions for forming a conformal film using siloxane material may be adjusted to, for example, 5 to 100 sccm (e.g., 25 sccm) of a Si-containing material gas such as trimethoxysilane, 20 to 500 sccm (e.g., 100 sccm) of an oxidizing gas such as O2, 10 to 200 sccm (e.g., 50 sccm) of a hydrocarbon gas such as hexane, 100 to 2,000 sccm (e.g., 650 sccm) of an inert gas such as He, and pressure of 50 to 500 Pa (e.g., 133.3 Pa). The laminated silazane layers may be constituted by a mixture of SiNH and SiNCH, instead of films of the same type.

For example, adopting a laminated structure of silazane and siloxane provides a film thickness ratio of 2 to 8 (silazane layer) to 1 to 4 (siloxane layer), although the specific ratio varies depending on the depth of the STI structure in which the film is embedded (for example, refer to U.S. Publication No. 2006-0228866, U.S. Pat. Nos. 6,403,486, and 6,835,664, the disclosure of which is incorporated herein by reference in their entirety). In an embodiment of the present invention, a siloxane layer can be formed by, for example, using any of the methods described in U.S. Pat. Nos. 6,455,445, 6,818,570 and 6,740,602, U.S. patent application Ser. No. 11/465,571 owned by the same assignee, and the like (the disclosure of which is incorporated herein by reference in their entirety).

9) A method according to any one of 1) to 8) above, characterized in that, if a linear or ring-type material such as Si—N—Si, N—Si—N, H—Si—H or NH—Si—NH is used as the material for silazane-based film, the flow rate is adjusted to a range of 1 to 1,000 sccm (including, for example, 10 sccm, 50 sccm, 100 sccm, 300 sccm, 60 sccm, and flow rates between any two of the foregoing).

10) A method according to any one of 1) to 9) above, characterized in that an inert gas such as He or Ar is used and its flow rate is adjusted to a range of 30 to 5,000 sccm (including, for example, 100 sccm, 500 sccm, 1,000 sccm, 3,000 sccm, and flow rates between any two of the foregoing).

11) A method according to any one of 1) to 10) above, characterized in that a plasma pre-process is performed to improve the wettability of the foundation film and during this process a gas selected from the group consisting of H2, Ar, N2, etc., in consideration of the material of the foundation film is introduced to generate plasma to perform surface treatment. The plasma pre-processing conditions may be set, for example, to a flow rate of 0.2 to 3 SLM (e.g., 1 SLM) if He, etc., is used, pressure of 50 to 600 Pa (e.g., 266.6 Pa), RF frequency of 2 to 60 MHz (e.g., 13.56 MHz), and power of 40 to 800 W (e.g., 200 W). If the foundation film is a nitride film, basically an oxidizing gas is used. If the foundation film is an oxidizing film, basically H2 or other inert gas is used. However, He gas may also be used if using oxygen would increase the oxidization power with respect to the foundation.

12) A method according to any one of 1) to 11) above, characterized in that a post-process identical to 7) above is performed in the same chamber after a silazane-based film has been formed, in order to suppress moisture absorption, etc., caused by exposure of the wafer to atmosphere.

13) A method according to any one of 1) to 12) above, characterized in that, if the reactor is cleaned after a film has been formed, the low susceptor temperature such as 0° C. allows cleaning to be performed once every 25 wafers processed, for example, by means of controlling the temperature to rise from a range of −50 to 50° C., which is the control temperature range of the refrigerant circulation apparatus while a film is being formed, to a level exceeding 50° C. Performing cleaning this way removes from the interior of the reactor the reactant residues formed in the film forming process. As for the cleaning gas, the basic conditions may be set, for example, to 0.3 to 3 SLM (e.g., 1 SLM) of a fluorine cleaning gas such as NF3, 1 to 10 LLM (e.g., 5 SLM) of an inert gas such as Ar, and pressure of 300 to 1,500 pa (e.g., 730 Pa). If O2 is introduced, its flow rate can be set to 0.4 to 2 SLM (e.g., 1 SLM). Heating can be implemented during cooling by using a gas heating unit, where use of this unit to introduce a high-temperature gas from outside the reactor (for example, by feeding a radicalized gas through a pipe) allows the surface temperature in the reactor to be raised. This high-temperature gas can be generated by heating a gas using a resistance-heating type heater, or by heating a gas through direct application of RF power to the introduced gas. The cleaning gas may be introduced through a gas heating unit or without using a gas heating unit.

14) A method according to any one of 1) to 13) above, characterized in that, since the silazane-based film deposited on the silicon processing target (substrate) is in a liquid reactant state, H2O annealing is performed to promote Si—O replacement and carbon dissociation at a low temperature in order to improve film density and chemical-solution resistance. The method is also characterized in that the gas introduced during annealing is an oxidizing gas such as O2. H2O is introduced by, for example, causing H2O that has been vaporized by a vaporizer to merge with other gas from a dry gas line immediately near the reactor and then guiding the merged gas into the reaction chamber. The introduction conditions can be set, for example, to an introduction temperature in a range of 85 to 150° C. (including, for example, 90° C., 100° C., 120° C., 140° C., and temperatures between any two of the above), H2O flow rate of 0.1 to 5 g/min (or preferably 0.5 to 3 g/min per 21,000 to 25,000 cm$^3$ of reaction chamber volume), and atmospheric pressure or less (with the processing chamber evacuated using a dry pump: 100 to 100,000 Pa, or preferably 500 to 10,000 Pa), using a carrier gas selected from inert gas such as He, Ar, etc. and oxidizing as such as O2, CO2, etc. or mixed thereof. The flow rate of the inert gas is 100 to 100,000 sccm (or preferably 500 to 10,000 sccm), flow rate of the oxidizing gas is 10 to 5,000 sccm (preferably 50 to 500 sccm), and processing time is 1 to 90 minutes (or preferably 10 to 70 minutes). For your information, the silicon substrate remains heated to a temperature of 100 to 400° C. H2O may be introduced using an existing gas line or by providing a separate gas line. Normally H2O is introduced from the shower plate, but the point of introduction is not limited to the shower plate. Since the silazane-based film is liquid, H2O can be introduced deep among oxygen atoms by performing H2O annealing at a relatively low temperature.

15) A method according to any one of 1) to 14) above, characterized in that the liquid reactant deposited on the silicon processing target (substrate) is hardened at a temperature of 200° C. or above, followed by carbon dissociation and Si—O replacement. The heat treatment temperature is 200 to 600° C. (including, for example, 250° C., 300° C., 400° C., and temperatures between any two of the foregoing), and the gas to be introduced is selected from oxidizing gas such as O2, O3, CO2, H2O, etc. and inert gas such as N2, He, Ar, etc. and mixed. Representative flow rates are 0.5 to 2 (e.g., 1 SLM) for N2 and 100 to 1,000 sccm (e.g., 500 sccm) for O2, while the pressure is 200 to 1,500 (e.g., 800 Pa) and processing time is 1 to 60 minutes.

16) A method according to 14) or 15) above, characterized in that the final heat treatment step is performed at 700 to 1,000° C. in a vacuum or in an atmosphere of a gas selected from oxidizing gas such as O2, O3, CO2, H2O, etc. and inert gas such as N2, He, Ar, etc. and mixed. A representative flow rate is 0.5 to 2 SLM (e.g., 1 SLM) for N2, while the processing time is 20 to 100 minutes (e.g., 60 minutes).

17) A method according to 14), 15) or 16) above, characterized in that the heat treatment is performed in one of the three combinations of 14)+15)+16) above, 14)+15) above, and 15)+16) above.

18) A method according to any one of 1) to 17) above, wherein the method of Si—O replacement and carbon dissociation includes a heat treatment method using a UV lamp having a wavelength selected from a range of 126 to 350 nm. The method is characterized in that the gas introduced at a susceptor temperature in a range of 200 to 600° C. is a mixture of oxidizing gas such as O2, O3, CO2, N2O, H2O, etc., and inert gas such as N2 and He, Ar, etc. For example, the UV lamp power is 3 to 10 mW/cm$^2$, pressure is 1 to 100 Torr (e.g., 45 Torr), and processing time is approx. 15 to 60 minutes. This processing can be adopted as an alternative to all of 14), 15) and 16). In addition, methods according to combinations of 14), 15) and 18), and 14), 18) and 16), can be used. The former combination is effective when the device process imposes temperature limitations.

In the above embodiments, the numerical numbers applied in embodiments can be modified by a range of at least ±50% in other embodiments, and the ranges applied in embodiments may include or exclude the endpoints.

In the present disclosure where conditions and/or structures are not specified, the skilled artisan in the art can readily provide such conditions and/or structures, in view of the present disclosure, as a matter of routine experimentation. Additionally, the conditions and/or structures disclosed in U.S. patent application Ser. Nos. 11/465,751 and 11/759,159 owned by the same assignee can be used in embodiments of the present invention.

The present invention will be explained in detail with reference to examples. However, the examples are not intended to limit the present invention.

It has been confirmed that, when a silazane-based film is formed without using any hydrocarbon solvent to prevent the problems associated with conventional methods, the flowability would become insufficient. It has also been confirmed that, when 1,1,3,3-tetramethyl disilazane or other material having CH3 groups at ends is used and NH3 is also used as an additive gas to form a silazane-based film (SiNCH-based film) without introducing any hydrocarbon gas in order to reduce the ratio of carbon introduced into the film and also form a Si—N and Si—H skeleton (Example 1), a certain level of flowability would be achieved but the flowability would still be low. On the other hand, it has been confirmed that, when a material not containing carbon is used to form a silazane-based film (SiNH-based film) containing virtually no carbon (Example 2), the flowability would become insufficient at a RF power of 100 W or more.

In an evaluation for the purpose of improving flowability conducted at a discharge gap of 16 to 28 mm, it was shown that increasing the discharge gap would improve flowability and achieve favorable filling characteristics. Also, increasing the discharge gap would also achieve favorable filling characteristics even when more RF power is applied, as favorable results were achieved at a discharge gap of 28 mm when the RF power was increased to 600 W. Also when the discharge gap was set to 28 mm, reducing the RF power to 100 W resulted in a very favorable filling condition. Based on the above, it is considered that increasing the discharge gap accelerated the breakdown of carbon in the material during the plasma reaction, and this solvent effect improved the flowability.

Also, two heat treatment methods were evaluated with these films. The major difference in heat treatment between the two methods lies in whether carbon dissociation and Si—O replacement are performed while the formed film deposited on the silicon substrate is still liquid, or carbon dissociation and Si—O replacement are performed after the surface is hardened first, as described under Example 3 later. As the subsequent final heat treatment step (at high temperature), heat treatment was performed for 1 hour in a N2 atmosphere at 800° C. and the resulting film shrinkage rate was evaluated. It is said that the film shrinkage rate may preferably be 20% or less because it affects distortion of the foundation and cracking of the film. In fine areas of high aspect ratios in STI and other structures, high film shrinkage may cause separation and void generation at the bottom of the STI structure, which could result in improper insulation. Also, the fine STI structure may tilt due to distortion, resulting in an improper shape. The shrinkage rate can be measured by calculating the change in film thickness and the decrease in embedded film compared to the levels before the heat treatment, by using bare Si. Based on this calculation, it was confirmed that, as shown in the examples described later, the film shrinkage rate improved to 20% or less (including, for example, 15%, 10%, 5%, and rates between any two of the foregoing). On the other hand, the film density results varied significantly, which is probably due to the different heat treatment steps where the film shrinks.

As for the film density in the humidifying process (H2O annealing) performed while the film is still liquid, the result would become, for example, 2.3 g/cm$^3$ (Example 3) (including, for example, 2.4 g/cm$^3$, 2.6 g/cm$^3$, 2.8 g/cm$^3$, and densities between any two of the foregoing), which is better than the film density of 2.2 g/cm$^3$ (Example 3) obtained by hardening the surface first (via heat or UV annealing). This result is also evident from the chemical-solution resistance test shown in FIG. 6, which suggests that the chemical-solution etch rate significantly improved to a level equivalent to the etch rate achieved with a thermal oxide film (the wet-etch rate can be evaluated using LAL500 by Stella Chemifa, which is a buffered hydrofluoric acid containing surface active agent). Films formed by conventional methods achieved results equivalent to those of a thermal oxide film in an evaluation using blanket wafers. However, the etch rate quickened on patterns having surface irregularity and in an evaluation of chemical-solution etch rates using embedded films, quickening of the etch rate to approx. 1.5 times that on a blanket wafer was confirmed.

When 1,1,3,3-tetramethyl disilazane containing carbon is used, the film shrinkage rate becomes 20% or less because no hydrocarbon solvent is used, and favorable results are obtained compared to when a hydrocarbon solvent is used. For your reference, the material is not limited to 1,1,3,3-tetramethyl disilazane having H and CH3 groups at ends, and a material having 1, 2 or 3 substituent groups or a C2H5 group at ends may also be used. For example, tetraethyl disilazane, dimethyl disilazane, etc., can be used.

As for the method to form a silazane-based film containing no or virtually no carbon in the film, SiH4+NH3 can be used to form a SixNyHz film, for example (Example 2). Absence of carbon weakens the flowability and thus reduces the filling characteristics. The reason is likely the faster reaction speed because there is no solvent. When the wafer surface was observed using a microscope, silicon powder was deposited over a wide range. Based on the above, it was confirmed that reducing the discharge gap from 16 to 8 mm to lower the reaction speed would improve flowability and also achieve favorable filling characteristics. If the RF power is also reduced, the filling characteristics would improve further. This film was also evaluated with two thermal processes, as with the SixNyCzHa film. As a result, the film shrinkage rates were approx. 10% with both processes (15% or less depending on the embodiment including, for example, 10%, 8%, 6%, 4%, and rates between any two of the foregoing), and a film density of 2.3 g/cm$^3$ (including, for example, higher densities such as 2.4 g/cm$^3$, 2.6 g/cm$^3$, 2.8 g/cm$^3$, and densities between any two of the foregoing) was achieved when heat treatment at 800° C. was performed subsequently. Since both processes resulted in values equivalent those of a thermal oxide film in the chemical-solution resistance evaluation, wet-etch rates were evaluated using samples produced by filling a film in a pattern having surface irregularity. As a result, the etch rates were roughly the same as the evaluation results obtained using blanket wafers. It is assumed that the same film quality was achieved on patterns having surface irregularity and on blanket wafers.

When the film contains no carbon, the film shrinkage rate improves significantly and at the same time a stable embedded film can be obtained. Sufficient flowability can be ensured without carbon, by adjusting the reaction suppression parameter, or discharge gap, to 16 mm or less, and also by lowering the RF power.

Further aspects, features and advantages will become apparent from the detailed description of the preferred examples which follows. The preferred embodiments are not intended to limit the present invention.

FIG. 1 diagrammatically shows a plasma CVD apparatus usable in an embodiment of this invention. The plasma CVD device includes a reaction chamber 1, a gas inlet port 6, a susceptor 3 (serving as a lower electrode) provided with an embedded temperature controller which can be a coil in which a coolant or heating medium flows in a channel to control the temperature. A showerhead 2 (serving as an upper electrode) may be disposed immediately under the gas inlet port. The showerhead 2 has a number of fine openings at its bottom face and can inject reaction gas to the semiconductor substrate 5 therefrom. There is an exhaust port 8 at the bottom of the reaction chamber 1. This exhaust port 8 is connected to an outer vacuum pump (not shown) so that the inside of the reaction chamber 1 can be evacuated. The susceptor 3 is placed in parallel with and facing the showerhead 2. The susceptor 3 holds a semiconductor substrate 5 thereon and heats or cools it with the temperature controller. The gas inlet port 6 is insulated from the reaction chamber 1 and connected to an outer high frequency power supply 4. Alternatively, the susceptor 3 can be connected to the power supply 4. Thus, the showerhead 2 and the susceptor 3 act as a high frequency electrode and generate a plasma reacting field in proximity to the surface of the semiconductor substrate 5.

The gases can be mixed upstream of the gas inlet port 6 to constitute a process gas, or each or some of the gases can be introduced separately into the showerhead 2. The space between the showerhead 2 and the semiconductor substrate 5, both located inside of the reaction chamber 1 which is already evacuated, is charged with RF power which has a single frequency or mixed frequencies (e.g., 13.56 MHz to 60 MHz), and the space serves as a plasma field. The susceptor 3 continuously heats or cools the semiconductor substrate 5 with the temperature controller and maintains the substrate 5 at a predetermined temperature that is desirably −50° C.-50° C. The process gas supplied through the fine openings of the showerhead 2 remains in the plasma field in proximity to the surface of the semiconductor substrate 5 for a predetermined time.

When the insulation film is deposited on the substrate, the gas inside the reaction chamber is discharged through the exhaust port 8 and replaced with a reduction gas or a mixture of a reduction gas and an inert gas, while maintaining the substrate in the reaction chamber.

Figure 3:
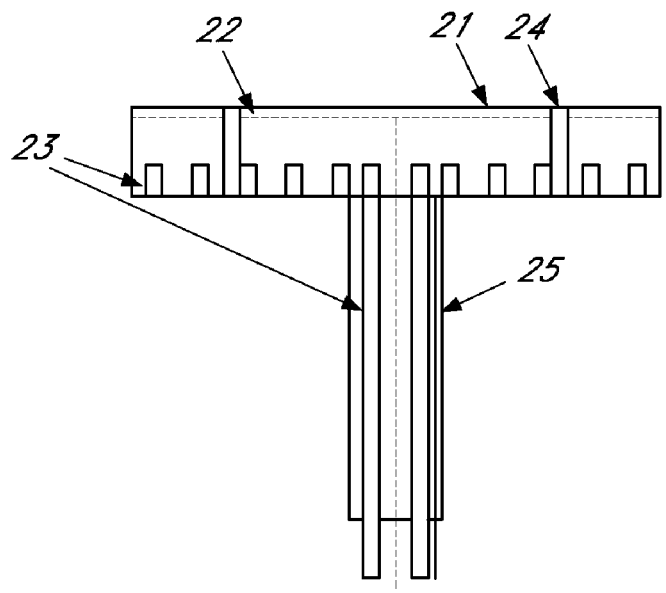
FIG. 3 is a schematic diagram showing a cooling susceptor provided in a plasma CVD apparatus usable in an embodiment of the present invention.

The temperature of the susceptor 3 can be controlled by means of a heater (not shown) and cooling conduits 23 as shown in FIG. 3. This cooling susceptor is made of ceramics and is provided with the cooling conduits 23 at a lower portion of a metal plate for RF 22 and a shaft portion so that a cooling medium such as water can circulate. The temperature is measured by a thermal coupler 25 provided at a lower portion of the metal late 22. The metal plate has holes 24 for wafer lift pins and a wafer supporting portion is formed on the metal plate 22.

Figure 2:
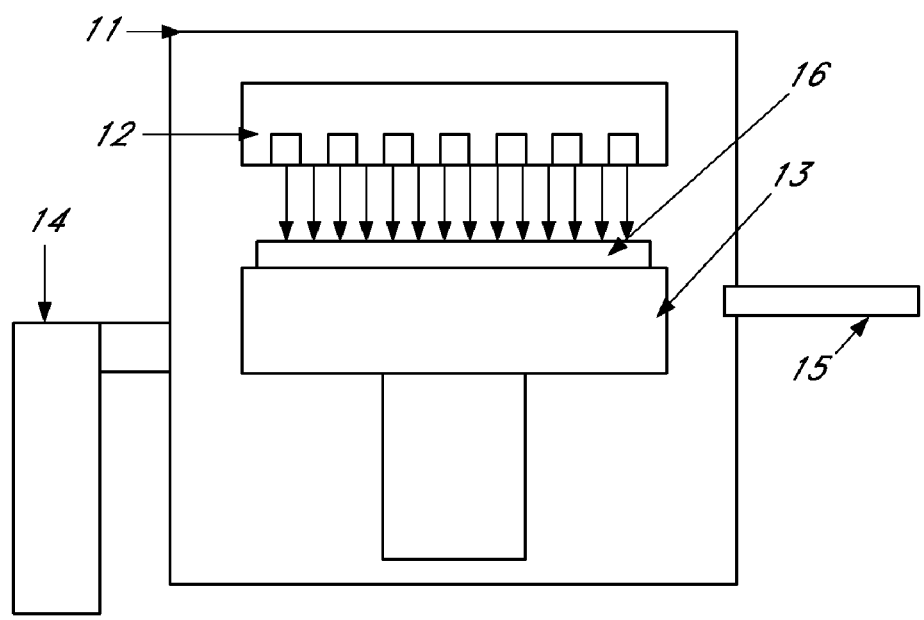
FIG. 2 is a schematic diagram showing a UV curing apparatus usable in an embodiment of the present invention.

In an embodiment, subsequently, a curing process is performed on the semiconductor substrate taken out from the reactor using the UV cure apparatus shown in FIG. 2. The UV cure apparatus comprises a process chamber 11, a UV lamp 12, a susceptor 13, an exhaust port 14, and a gas inlet port 15. The UV lamp and a susceptor 13 are disposed parallel, and are heated by heaters embedded in them respectively. The semiconductor substrate 16, which is a workpiece, is placed on the susceptor 13 and is heated and held. Projected from the UV lamp whose wavelength range is selected from 172-250 nm, light is irradiated toward the semiconductor substrate 16. When the semiconductor substrate is irradiated, gases such as He, $H_2$, $N_2$, $O_2$, $CO_2$, etc. (depending on the intended type of film) are being introduced through the gas inlet port 15. As soon as pores are formed in the film with H, O, C, etc. being desorbed from a low-dielectric-constant structure, unstable bonds no longer exist; hence, a film having a lower dielectric constant and higher strength can be obtained.

As the UV cure apparatus, the apparatus disclosed in commonly assigned U.S. patent application Ser. No. 11/040,863 can be used, the disclosure of which is incorporated herein by reference in its entirety.

Figure 4:
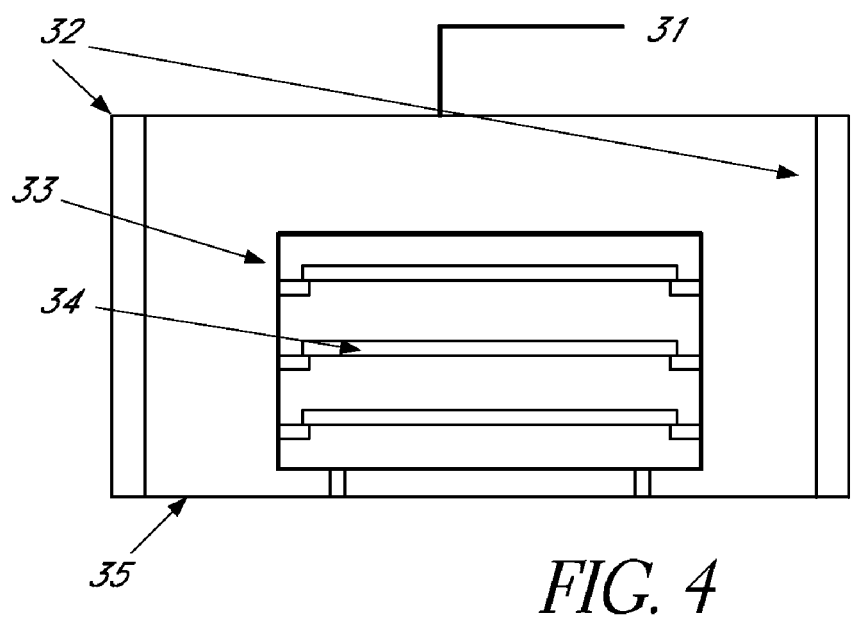
FIG. 4 is a schematic diagram showing a thermal annealing apparatus usable in an embodiment of the present invention.

The heat-treating step can be performed by thermal annealing in place of the UV curing. FIG. 4 shows a schematic diagram of a thermal annealing apparatus. In a chamber 35, a quartz boat 33 is provided, and a substrate 34 is placed inside the quartz boat 33. The temperature inside the quartz boat 33 is controlled by a heater 32, and gases can be introduced inside through a gas inlet port 31.

In an embodiment of the present invention, a material such as $SiH_4$ or $Si_2H_6$ and a nitrogen additive such as $NH_3$ or $N_2$ are caused to undergo a decomposition reaction by means of plasma on a silicon substrate retained on a susceptor cooled to a temperature of −50 to 50° C. At this time, the film is constituted by only Si, N and H. Thereafter, annealing is performed in an oxidizing gas atmosphere. In consideration of the effect of heat, a method that uses UV curing is selected if the heat treatment temperature is low. If the heat treatment temperature can exceed 450° C., then hot annealing is preferred. Particularly with processes performed close to a substrate, a post-processing is performed where heat near 700° C. is required. In this respect, an appropriate annealing temperature needs to be selected by considering the required heat resistance, etc.

An embodiment of the present invention can be implemented using an apparatus such as the one explained above.

A reactant is formed on a silicon processing target in a state close to liquid by maintaining the processing target on a low-temperature susceptor controlled at −50 to 50° C. inside the plasma CVD reaction chamber. The reactant formed on the silicon processing target is close to a liquid state and therefore flowable, and filling is performed using the surface tension on patterns having surface irregularity that contain a semiconductor circuit. The embedded film is basically constituted by Si, N and H, but carbon may be contained depending on the conditions. The details of the heat treatment performed thereafter are determined according to the purpose. By exposing the formed film directly to atmosphere while the environment is still a vacuum, the film surface undergoes oxidization and volatilization due to O, etc., contained in air, and therefore if any process after a film has been formed is performed using a separate apparatus, the surface needs to be protected by implementing a pre-bake process at 100 to 400° C. in order to harden the surface before the film is exposed to atmosphere. After the pre-bake, the film is no longer affected by its surface and therefore the waiting times needed before the subsequent H2O process or heat treatment process at 400 to 1,000° C. are not limited, and thus a stable film can be formed. After the heat treatment at 400 to 1,000° C., the film constituted by Si, N and H, and also C in some case, changes to one constituted by Si and O, and also a small amount of H depending on the conditions. If the heat treatment temperature exceeds 800° C., the obtained film quality becomes equivalent to that of a silicon oxide film formed by thermal oxidization, which confirms that the film is very dense and stable (Examples 1 and 2). Based on the above, the present invention can be applied in substrate processes where STI, PMD or other filling steps are needed and where high film quality is also required.

As explained above, in an embodiment of the present invention the problem of higher shrinkage rate caused by use of $C\alpha H\beta O\gamma$ solvents, traditionally added to the material under conventional methods to improve flowability, can be prevented and the carbon content can also be reduced. Additionally, the flowability can be effectively controlled in the SiNCH process by adjusting the RF power to 600 W or less and the discharge gap to 16 mm or more. In the SiNH process, the present invention was confirmed effective at a RF power of 600 W or less and discharge gap of 16 mm or less. If the material contains carbon, the film tends to shrink. However, the shrinkage rate decreased compared to when a carbon-containing solvent was added, and the allowable range of 20% or less, or preferably 15% or less, or more preferably 10% or less, was satisfied, and moreover the film could be expanded depending on the conditions, which would make it possible to form a favorable embedded oxide film by using a selected material. For example, adding a nitrogen additive (for example, adding approx. 500 sccm of NH3) to the material (such as 1,1,3,3 tetramethyl disilazane) would further increase the peak strength of Si—N and Si—H, and if the formed film is heat-treated the film shrinkage would decrease while the film would also exhibit a tendency to expand (other effective methods to expand the film include increasing the flow rate of NH3). If a silicon-based hydrogen gas is used as the material, on the other hand, addition of a nitrogen additive eliminates film shrinkage because the film does not contain carbon.

EXAMPLE

Experiments were conducted as described below. In these experiments, a plasma CVD device shown in FIG. 1 and FIG. 3 was used as an experimental device. The diameter of a substrate was 200 mm. The thickness of each insulation film was set at 500 nm. An insulation film was formed on and filled in an irregular surface of SiN formed on a Si wafer including a hole having a width of 60 nm and a depth of 600 nm. The conditions and results are indicated in tables below. Annealing was conducted in a UV irradiation apparatus shown in FIG. 2 or in a furnace chamber shown in FIG. 4 made of a quartz tube provided with a quartz boat capable of performing annealing at a vacuum pressure to atmospheric pressure.

Example 1

Evaluation Results of SiNCH Silazane Process

Films were formed under the conditions shown in Table 1 and below, and the film characteristics were examined an hour after the heat treatment at 900° C.

Process Sequence:
Film forming: Temperature 0° C., pressure 266.6 Pa
H2O annealing: 1 hour of steam processing at 130° C. (H2O flow rate 1 g/min)
Heat treatment: 1 hour of O2/N2 processing at 400° C. (N2 1 SLM, pressure 800 Pa; the experiment was conducted using a chamber separate from the one used for H2O processing.)
High-temperature heat treatment: 1 hour of N2 processing at 900° C. (N2 flow rate 1 SLM, atmospheric pressure)

As shown in Table 1, silazane-based films formed without using organic solvent, but using a material containing carbon and an additive gas not containing carbon, exhibited improved filling characteristics through lowering of the RF power when the electrode gap was narrow. When the electrode gap was wide, no problem occurred even at relatively high RF powers (favorable filling characteristics were achieved at 100 W or less when the electrode gap was 16 mm, at 200 W or less when the gap was 20 mm, at 300 W or less when the gap was 24 mm, and at 600 W or less when the gap was 28 mm). Although both the heat shrinkage rate and film density were within the allowable ranges, both improved when the RF power was higher. Accordingly, it may be concluded that the electrode gap and RF power may preferably be set to 24 mm or more and 300 W or more, respectively (such as 24 mm and 300 W or 28 mm and 400 to 600 W).

TABLE 1

| Material | Material (sccm) | NH3 (sccm) | He (SLM) | Discharge gap (mm) | 13.56 MHz (W) | Filling characteristics | Leak current 2 MV (A/cm2) | Dielectric breakdown (MV) | Dielectric constant | Density (g/cm3) | Shrinkage rate (%) |
|---|---|---|---|---|---|---|---|---|---|---|---|
| 1,1,3,3-TMDS | 30 | 20 | 2 | 16 | 100 | Completely embedded | 3E−10 | 6.9 | 4 | 2.2 | 19 |
| ↓ | ↓ | ↓ | ↓ | ↓ | 200 | Voids generated in some areas | 2.5E−10 | 6.9 | 3.96 | 2.29 | 15 |
| ↓ | ↓ | ↓ | ↓ | 20 | 100 | Completely embedded | 3.2E−10 | 7.3 | 3.99 | 2.17 | 20 |
| ↓ | ↓ | ↓ | ↓ | ↓ | 200 | ↓ | 2.7E−10 | 7.1 | 3.93 | 2.28 | 18 |
| ↓ | ↓ | ↓ | ↓ | ↓ | 300 | Voids generated in some areas | 4.1E−10 | 6.5 | 3.88 | 2.32 | 16 |
| ↓ | ↓ | ↓ | ↓ | 24 | 100 | Completely embedded | 2.3E−10 | 6.8 | 3.87 | 2.21 | 19 |
| ↓ | ↓ | ↓ | ↓ | ↓ | 200 | ↓ | 3.2E−10 | 6.5 | 3.92 | 2.27 | 17 |
| ↓ | ↓ | ↓ | ↓ | ↓ | 300 | ↓ | 1.9E−10 | 6.8 | 3.88 | 2.31 | 15 |
| ↓ | ↓ | ↓ | ↓ | ↓ | 400 | Voids generated in some areas | 2.0E−10 | 7 | 3.9 | 2.35 | 13 |
| ↓ | ↓ | ↓ | ↓ | 28 | 100 | Completely embedded | 2.5E−10 | 6.6 | 3.85 | 2.17 | 19 |
| ↓ | ↓ | ↓ | ↓ | ↓ | 200 | ↓ | 2.9E−10 | 6.9 | 3.83 | 2.26 | 17 |
| ↓ | ↓ | ↓ | ↓ | ↓ | 300 | ↓ | 3.1E−10 | 6.3 | 3.81 | 2.33 | 16 |
| ↓ | ↓ | ↓ | ↓ | ↓ | 400 | ↓ | 3.1E−10 | 6.8 | 3.88 | 2.36 | 14 |
| ↓ | ↓ | ↓ | ↓ | ↓ | 500 | ↓ | 2.7E−10 | 6.8 | 3.84 | 2.39 | 12 |
| ↓ | ↓ | ↓ | ↓ | ↓ | 600 | ↓ | 2E−10 | 7 | 3.86 | 2.4 | 7 |

Example 2

Evaluation Results of SiNH Silazane Process

Films were formed under the conditions shown in Table 2 and below, and the film characteristics were examined an hour after the heat treatment at 900° C.

Process Sequence:
Film forming: Temperature 0° C., pressure 266.6 Pa
H2O annealing: 1 hour of steam processing at 130° C. (H2O flow rate 1 g/min)
Heat treatment: 1 hour of O2/N2 processing at 400° C. (N2 1 SLM, pressure 800 Pa; the experiment was conducted using a chamber separate from the one used for H2O processing.)
High-temperature heat treatment: 1 hour of N2 processing at 900° C. (N2 flow rate 1 SLM, atmospheric pressure)
Chemical-solution resistance evaluation: A stock solution of LAL500 was used to conduct the evaluation. A thermal oxide film was used as a reference. The etch rate of the thermal oxide film was 43 nm/min. The decrease in film thickness at the top of the STI structure was calculated based on the cross-section observation result.

As shown in Table 2, silazane-based films formed without using organic solvent, but using a material not containing carbon and an additive gas not containing carbon, exhibited improved filling characteristics through lowering of the RF power when the electrode gap was wide. When the electrode gap was narrow, no problem occurred even at relatively high RF powers (favorable filling characteristics were achieved at 30 W or less when the electrode gap was 16 mm, at 100 W or less when the gap was 10 mm, at 200 W or less when the gap was 8 mm, and at 600 W or less when the gap was 6 mm). This is opposite of the control applicable to carbon-containing silazane-based films formed in Example 1. Although both the heat shrinkage rate and the film density were within the allowable ranges, the trend of heat shrinkage was reversed and the film expanded when the RF power exceeded 100 W. The chemical-solution resistance was favorable with all films.

initial surface hardening sequence, and that's why an insufficient replacement probably caused the film to shrink significantly when carbon dissociated during the final high-temperature heat treatment due to the effect of heat. O2 gas is not introduced during the high-temperature heat treatment because Si in the foundation STI structure would be oxidized. When H2O annealing was performed initially at a relatively low temperature, on the other hand, the surface remained liquid and therefore it is assumed that O2 replacement was occurring effectively in the film. Accordingly, oxidization could be achieved at a low temperature, and carbon was removed completely in the subsequent processing at 400° C.

TABLE 2

| Material | Material (sccm) | NH3 (sccm) | He (SLM) | Discharge gap (mm) | 13.56 MHz (W) | Filling characteristics | Leak current 2 MV (A/cm2) | Dielectric breakdown (MV) | Dielectric constant | Density (g/cm3) | Shrinkage rate (%) | Chemical-solution resistance (nm/min) |
|---|---|---|---|---|---|---|---|---|---|---|---|---|
| SiH4 | 10 | 100 | 1 | 16 | 10 | Completely embedded | 9E−11 | 8.3 | 4.00 | 2.1 | 10 | <40 |
| ↓ | ↓ | ↓ | ↓ | ↓ | 30 | ↓ | 8.8E−11 | 8.0 | 3.98 | 2.29 | 8 | ↓ |
| ↓ | ↓ | ↓ | ↓ | ↓ | 50 | Some voids | 1E−10 | 8.1 | 4.05 | 2.29 | 5 | ↓ |
| ↓ | ↓ | ↓ | ↓ | 10 | 10 | Completely embedded | 6E−11 | 8.3 | 3.97 | 2.11 | 11 | ↓ |
| ↓ | ↓ | ↓ | ↓ | ↓ | 30 | ↓ | 7E−11 | 8.7 | 3.99 | 2.14 | 7 | ↓ |
| ↓ | ↓ | ↓ | ↓ | ↓ | 50 | ↓ | 8E−11 | 8.1 | 3.99 | 2.22 | 5 | ↓ |
| ↓ | ↓ | ↓ | ↓ | ↓ | 100 | ↓ | 9E−11 | 8.2 | 4.05 | 2.3 | 4 | ↓ |
| ↓ | ↓ | ↓ | ↓ | ↓ | 200 | Some voids | 9E−11 | 7.7 | 4.05 | 2.3 | −3 | ↓ |
| ↓ | ↓ | ↓ | ↓ | 8 | 10 | Completely embedded | 1E−10 | 7.5 | 4.01 | 2.07 | 8 | ↓ |
| ↓ | ↓ | ↓ | ↓ | ↓ | 30 | ↓ | 9.5E−11 | 7.8 | 3.97 | 2.12 | 5 | ↓ |
| ↓ | ↓ | ↓ | ↓ | ↓ | 50 | ↓ | 7.9W−11 | 8.0 | 3.95 | 2.17 | 3 | ↓ |
| ↓ | ↓ | ↓ | ↓ | ↓ | 100 | ↓ | 8.6E−11 | 7.6 | 3.89 | 2.2 | 2 | ↓ |
| ↓ | ↓ | ↓ | ↓ | ↓ | 200 | ↓ | 8.2E−11 | 7.5 | 3.90 | 2.32 | −3 | ↓ |
| ↓ | ↓ | ↓ | ↓ | ↓ | 600 | Some voids | 8.9W−11 | 7.7 | 3.92 | 2.39 | −2 | ↓ |
| ↓ | ↓ | ↓ | ↓ | 6 | 10 | Completely embedded | 7.6E−11 | 7.9 | 3.88 | 2.09 | 9 | ↓ |
| ↓ | ↓ | ↓ | ↓ | ↓ | 30 | ↓ | 8.5E−11 | 7.7 | 3.90 | 2.12 | 7 | ↓ |
| ↓ | ↓ | ↓ | ↓ | ↓ | 50 | ↓ | 9.2E−11 | 7.9 | 3.92 | 2.16 | 5 | ↓ |
| ↓ | ↓ | ↓ | ↓ | ↓ | 100 | ↓ | 8.2E−11 | 8.0 | 3.93 | 2.25 | 2 | ↓ |
| ↓ | ↓ | ↓ | ↓ | ↓ | 200 | ↓ | 1E−10 | 8.0 | 3.90 | 2.32 | −4 | ↓ |
| ↓ | ↓ | ↓ | ↓ | ↓ | 600 | ↓ | 2E−10 | 7.9 | 3.94 | 2.38 | −5 | ↓ |

Example 3

Dependence of Film Characteristics by Heat Treatment Sequence

Films were formed under the conditions shown in Table 3 and below, and the film characteristics were examined. The initial surface hardening sequence represents a sequence without H2O annealing, while the initial liquid processing sequence represents one with H2O annealing.

Film Forming Conditions:
Susceptor temperature: 0° C.
Material flow rate: 1,1,3,3-TMDS 30 sccm
Additive gas flow rate: NH3 20 sccm
He flow rate: 2 SLM
Pressure: 266 Pa
13.56-MHz power: 28 W
Discharge gap: 400 mm The normal logic is that as the film shrinkage increases, the film density increases when the volume of film starts to shrink. As shown in Table 3, however, the film density resulting after H2O annealing was higher than when H2O annealing was not performed, despite the very low film shrinkage rate. A possible cause is the difference in the carbon dissociation and the Si—O replacement steps under the two methods. To be specific, complete replacement is considered difficult to achieve with N2/O2 processing at 400° C. in the It is also assumed that, despite the small film shrinkage rate, the density significantly increased because Si—O replacement also occurred at the same time.

Figure 5:
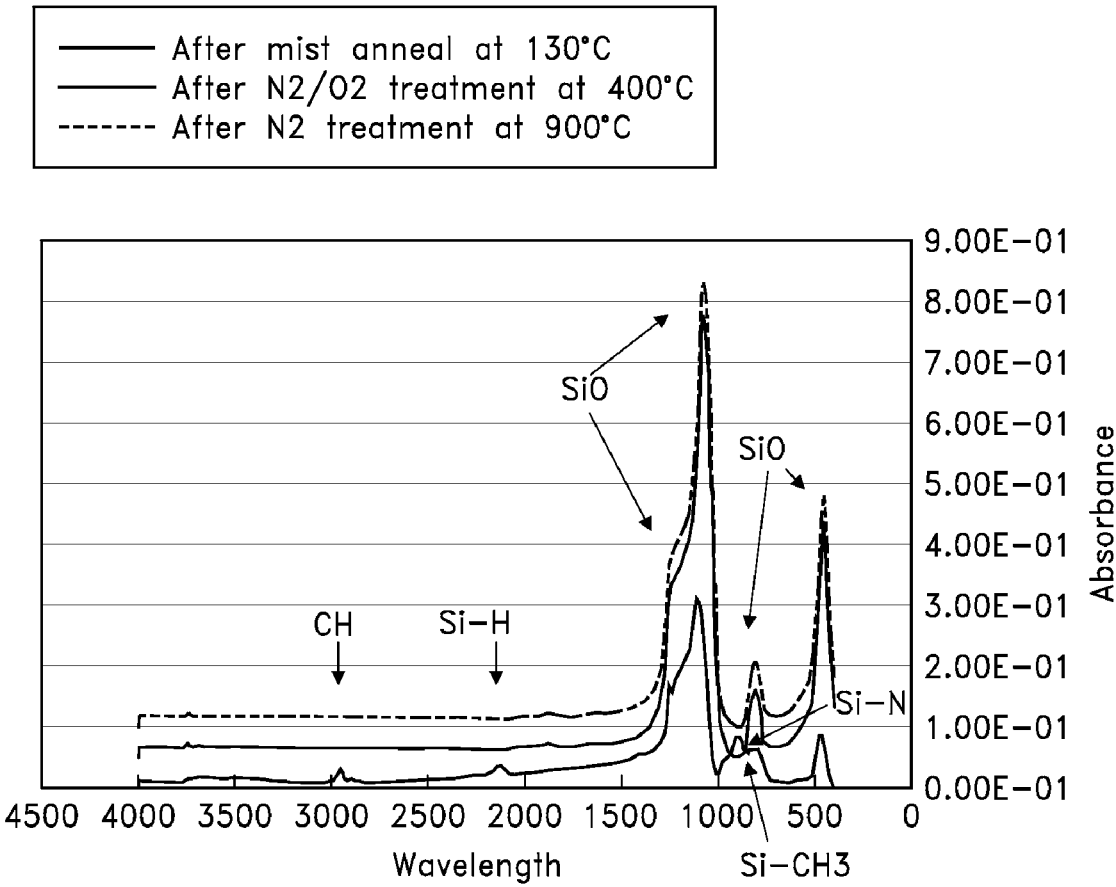
FIG. 5 is an FT-IR chart of the film upon the H2O annealing, thermal annealing, and thermal curing in an embodiment of the present invention.
Figure 6:
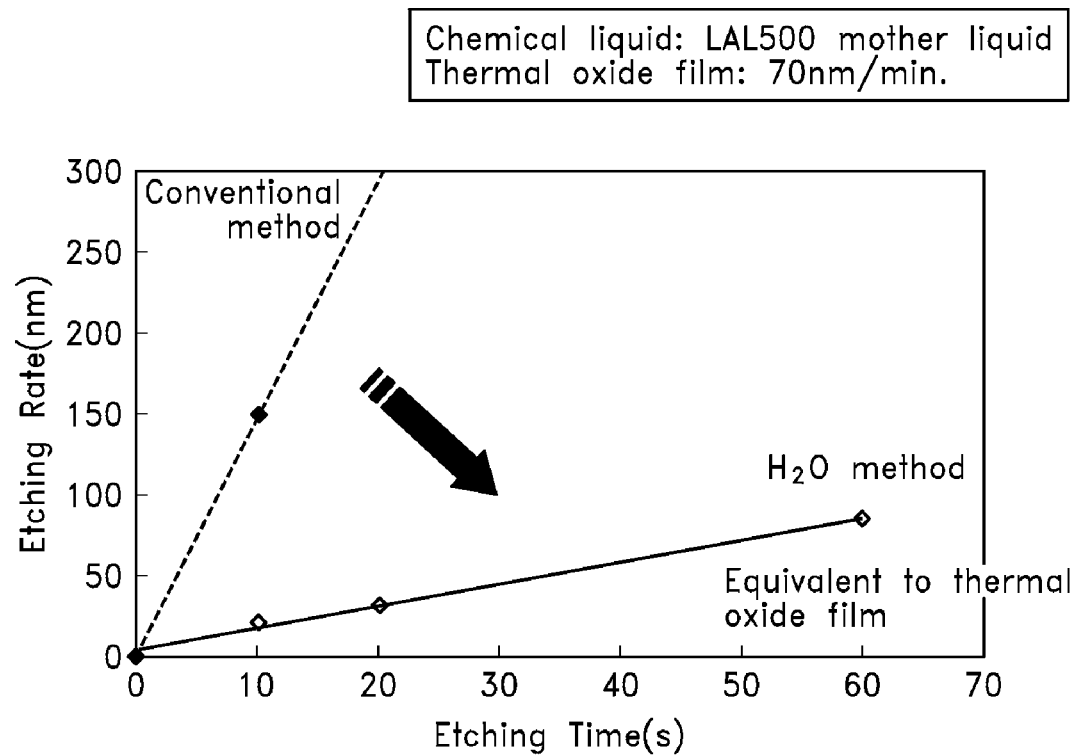
FIG. 6 is a graph showing wet-etch rates of the H2O annealed film in an embodiment of the present invention as compared with wet-etch rates of conventional film.

FIG. 5 shows FT-IR data of films obtained by the initial liquid processing sequence. Shown are the results taken an hour after H2O processing at 130° C., an hour after O2/N2 processing at 400° C., and an hour after N2 processing at 900° C. As shown in FIG. 5, 1,1,3,3-tetramethyl disilazane was used as the material and since no oxidizing gas was introduced, Si—O bond was absent after the deposition. In other words, the Si—O peak detected after the H2O processing was due to Si—O which had been introduced in the H2O processing. It is also shown that, as for the Si—O skeleton, Si—N, Si—H and some Si—CH3 changed to Si—O due to replacement during the subsequent O2/H2 heat processing. In an evaluation using blanket wafers, films formed by a conventional method (the silicon oxide film forming technology using siloxane material) presented results equivalent to those of a thermal oxide film. As shown in FIG. 6, however, the etch rate quickened on patterns having surface irregularity and in an evaluation of chemical-solution etch rates using embedded films, quickening of the etch rate to approx. 1.5 times that on a blanket wafer was confirmed. In this example, even the etch rates on patterns having surface irregularity were equivalent to those of a thermal oxide film (70±10 nm/min), suggesting an improvement in chemical-solution etch rates.

Example 4

SiH4+Nitrogen Gas+α(Process with a Small Amount of SiNCH Material Added)

Films were formed under the conditions shown in Table 4 and below, and the film characteristics were examined.

Process Sequence:

Film forming: Temperature 0° C., pressure 266.6 Pa

UV annealing: 15 minutes of UV curing using a Xe lamp (3 mW/cm$^2$) at 100° C.: The UV irradiation conditions included a susceptor temperature of 100° C., O2 flow rate of 1 SLM, He flow rate of 100 sccm, and pressure of 267 Pa.

High-temperature heat treatment: 1 hour of N2 processing at 900° C. (N2 flow rate 1 SLM, atmospheric pressure)

Chemical-solution resistance evaluation: A stock solution of LAL500 was used to conduct the evaluation. A thermal oxide film was used as a reference. The etch rate of the thermal oxide film was 43 nm/min. The decrease in film thickness at the top of the STI structure was calculated based on the cross-section observation result.

As shown in Table 4, favorable filling characteristics can be achieved, regardless of the electrode gap, using a mixing process where the flow rate of the carbon-containing material gas is adjusted to less than 50% of the flow rate of all material gases combined. In other words, forming a carbon-containing silazane-based film in the mixing process at a reduced carbon content allows a film offering low heat shrinkage rate and good chemical-solution resistance to be formed without being affected significantly by the electrode gap of 10 mm or 20 mm.

What is claimed is:

1. A method of forming a dielectric film, comprising:
   introducing a source gas comprising Si, N, H, and optionally C and having at least one bond selected from Si—N, Si—Si, and Si—H into a reaction chamber where a substrate is placed;
   depositing a silazane-based film comprising Si, N, H, and optionally C on the substrate in a liquid or flowable state by plasma reaction at −50° C. to 50° C., wherein the film is free of exposure of a solvent comprising C, H, and optionally O;
   heat-treating the silazane-based film on the substrate in a heat-treating chamber while introducing an oxygen-supplying source into the heat-treating chamber to release C from the film and increase Si—O bonds in the film; and
   high heat-treating the film at a temperature of 700° C.-1,000° C. in an inert gas environment upon the heat treatment step.

2. The method according to claim 1, wherein the heat-treatment step comprises introducing $O_2$, $O_3$, $CO_2$, $N_2O$, and/or $H_2O$ as the oxygen-supplying source and an inert gas into the heat-treating chamber and annealing the film by UV curing.

3. The method according to claim 1, wherein the substrate is placed between capacitively-coupled electrodes, between which a plasma is generated in the deposition step, and a gap between the electrodes is set at 16 mm or less in the deposition step.

4. The method according to claim 1, wherein the substrate is placed between capacitively-coupled electrodes, between which a plasma is generated in the deposition step, and the source gas is a mixture of a gas comprising Si, H, and N and a gas comprising Si, H, N, and C.

5. The method according to claim 1, wherein the source gas is a mixture of a gas constituted by Si, H, and optionally C, and a gas constituted by N and optionally H.

TABLE 3

| | Initial surface hardening sequence | | | Initial liquid processing sequence | | |
|---|---|---|---|---|---|---|
| Heat treatment method | Sequence | Film density (g/cm3) | Film shrinkage rate (%) | Sequence | Film density (g/cm3) | Film shrinkage rate (%) |
| 1 hour of steam processing at 130° C. | — | — | — | ○ | — | 5 |
| 1 hour of N2/O2 processing at 400° C. | ○ | — | 18 | ○ | — | 5 |
| 1 hour of N2 processing at 900° C. | ○ | 2.2 | 25 | ○ | 2.3 | 4 |

TABLE 4

| Material | Material (sccm) | 1,1,3,3 TMDS (sccm) | NH3 (sccm) | He (SLM) | Discharge gap (mm) | 13.56 MHz (W) | Filling characteristics | Leak current 2 MV (A/cm2) | Dielectric breakdown (MV) | Dielectric constant | Density (g/cm3) | Shrinkage rate (%) | Chemical-solution resistance (nm/min) |
|---|---|---|---|---|---|---|---|---|---|---|---|---|---|
| SiH4 | 25 | 20 | 50 | 1 | 10 | 100 | Completely embedded | 7E−11 | 8.7 | 3.99 | 2.21 | 10 | <40 |
| ↓ | ↓ | ↓ | ↓ | ↓ | 20 | ↓ | ↓ | 9E−11 | 9.1 | 3.91 | 2.25 | 7 | ↓ |
| ↓ | ↓ | ↓ | 100 | ↓ | ↓ | ↓ | ↓ | 1.5E−10 | 8.5 | 4.02 | 2.31 | 8 | ↓ |

It will be understood by those of skill in the art that numerous and various modifications can be made without departing from the spirit of the present invention. Therefore, it should be clearly understood that the forms of the present invention are illustrative only and are not intended to limit the scope of the present invention.

6. The method according to claim 5, wherein the gas constituted by N and optionally H is $NH_3$ or/and $N_2$.

7. The method according to claim 1, wherein the heat-treatment step comprises introducing $H_2O$ as the oxygen-supplying source into the heat-treating chamber and annealing the film at a temperature of 85° C.-150° C.

8. The method according to claim 1, wherein the heat-treatment step comprises introducing $O_2$, $O_3$, $CO_2$, $N_2O$, and/or $H_2O$ as the oxygen-supplying source and an inert gas into the heat-treating chamber and annealing the film at a temperature of 200° C.-600° C.

9. A method of forming a dielectric film, comprising:
    introducing a source gas comprising Si, N, H, and optionally C and having at least one bond selected from Si—N, Si—Si, and Si—H into a reaction chamber where a substrate is placed; and
    depositing a silazane-based film comprising Si, N, H, and optionally C on the substrate in a liquid or flowable state by plasma reaction at −50° C. to 50° C., wherein the film is free of exposure of a solvent comprising C, H, and optionally O,
    wherein the substrate is placed between capacitively-coupled electrodes, between which a plasma is generated in the deposition step,
    the source gas comprises Si, H, N, and C, and a gap between the electrodes is set at 16 mm or more in the deposition step, and
    no hydrocarbon gas is introduced into the reaction chamber.

10. The method according to claim 9, wherein RF power applied to the electrodes is 600 W or less in the deposition step.

11. The method according to claim 9, wherein the substrate is a semiconductor substrate which has an irregular surface including a concave portion.

12. The method according to claim 11, wherein the concave portion is filled with the film by conducting the gas-introducing step and the deposition step once or by repeating the gas-introducing step and the deposition step multiple times, and then the heating-treatment step is conducted.

13. The method according to claim 11, wherein the concave portion of the irregular surface has holes or grooves, and the deposition step is performed on the irregular surface to fill the holes or grooves with the inorganic silazane-based film.

14. The method according to claim 9, wherein the substrate has a silicon oxide conformal film formed from a siloxane material, on which the silazane-based film is deposited in the deposition step.

15. The method according to claim 9, wherein the silazane-based film is comprised of multiple silazane-based films which are constituted by Si, N, and H, and/or constituted by Si, N, H, and C.

16. The method according to claim 9, wherein in the gas-introducing step, an inert gas is added.

17. The method according to claim 9, further comprising treating a surface of the substrate with a plasma using He, Ar, or $N_2$ for improving affinity to the silazane-based film prior to the gas-introducing step.

18. The method according to claim 9, wherein in the gas-introducing step, no oxygen-supplying gas is introduced into the reaction chamber.

19. The method according to claim 9, further comprising cleaning the reaction chamber at a temperature of higher than 50° C. after the film depositing step is repeated multiple times.

20. The method according to claim 9, further comprising heat-treating the silazane-based film on the substrate in a heat-treating chamber while introducing $N_2$ into the heat-treating chamber and annealing the film by UV curing.

21. A method for forming an interconnect structure, comprising:
    forming a three-dimensional structure for interconnect in a substrate; and
    forming an insulation layer on a surface of the three-dimensional structure using the method of claim 9, followed by
    heat-treating the silazane-based film on the substrate in a heat-treating chamber while introducing an oxygen-supplying source into the heat-treating chamber to release C from the film and increase Si—O bonds in the film.

22. The method according to claim 21, further comprising wet-etching the insulation film.

23. The method according to claim 21, wherein the step of forming a three-dimensional structure comprises forming a layer of aluminum, tungsten, or tungsten silicon as a wiring layer and etching the layer in a pattern.

24. A method of forming a dielectric film, comprising:
    introducing a source gas comprising Si, N, H, and optionally C and having at least one bond selected from Si—N, Si—Si, and Si—H into a reaction chamber where a substrate is placed; and
    depositing a silazane-based film comprising Si, N, H, and optionally C on the substrate in a liquid or flowable state by plasma reaction at −50° C. to 50° C., wherein the film is free of exposure of a solvent comprising C, H, and optionally O,
    wherein the substrate is placed between capacitively-coupled electrodes, between which a plasma is generated in the deposition step,
    the source gas comprises Si, H, N, and C, and a gap between the electrodes is set at 16 mm or more in the deposition step, and
    the source gas is comprised of a gas constituted by Si, N, H, and C, and a gas constituted by N and optionally H.

25. The method according to claim 24, wherein the source gas is further comprised of a gas constituted by Si and H.

* * * * *